United States Patent [19]
Matsuura et al.

[11] Patent Number: 6,081,694
[45] Date of Patent: Jun. 27, 2000

[54] MOBILE TELEPHONE TRANSMITTER WITH INTERNAL AUXILIARY MATCHING CIRCUIT

[75] Inventors: Toru Matsuura, Neyagawa; Kaoru Ishida, Shijonawate; Hiroaki Kosugi, Hirakata; Youichi Morinaga, Yokohama, all of Japan

[73] Assignee: Matsushita Electric Industrial Co., Ltd., Osaka, Japan

[21] Appl. No.: 09/174,537

[22] Filed: Oct. 19, 1998

[30] Foreign Application Priority Data

Oct. 21, 1997 [JP] Japan ................................. 9-288582

[51] Int. Cl.[7] ..................................................... H04B 1/44
[52] U.S. Cl. ............................ 455/78; 330/306; 455/114; 455/553; 455/82
[58] Field of Search ............................... 455/78, 93, 126, 455/127, 107, 103, 553, 552, 114; 330/277, 51, 302, 306

[56] References Cited

U.S. PATENT DOCUMENTS

| | | | |
|---|---|---|---|
| 4,593,250 | 6/1986 | Lucas et al. | 330/107 |
| 5,423,074 | 6/1995 | Dent | 455/74 |
| 5,548,246 | 8/1996 | Yamamoto et al. | 330/51 |
| 5,784,687 | 7/1998 | Itoh et al. | 455/78 |
| 6,023,611 | 2/2000 | Bolin et al. | 455/114 |

*Primary Examiner*—Fan Tsang
*Assistant Examiner*—Blane J. Jackson
*Attorney, Agent, or Firm*—Smith, Gambrell & Russell, LLP

[57] ABSTRACT

Disclosed is a transmitter for switching and transmitting signals of plural frequency bands. For example, the signals of two frequency bands are switched and transmitted. For the transmission in a first frequency band, of transistors 104, 105 are turned off, whereby a power amplifying transistor 102 is matched by an input wide band matching circuit 101 and an output main matching circuit 103, so that the high efficiency linear amplification is accomplished. For the transmission in a second frequency band, the transistor 104 is turned on while the transistor 105 is turned off, whereby the power amplifying transistor 102 is matched by a capacitance 108 as well as the input wide band matching circuit 101 and the output main matching circuit 103, so that the high efficiency linear amplification is accomplished. An external switch for switching the matching circuits is thus unnecessary.

17 Claims, 5 Drawing Sheets

MOBILE TELEPHONE TRANSMITTER WITH INTERNAL AUXILIARY MATCHING CIRCUIT

BACKGROUND OF THE INVENTION

1. Field of the Invention

The present invention relates to a transmitter and a mobile telephone using the apparatus which are capable of switching a plurality of frequencies.

2. Description of the Related Art

A transmitter for switching a plurality of frequency bands has been heretofore considered to have a constitution as shown in a block diagram of FIG. 6. In this drawing, there is illustrated a transmission of two frequency bands. Such a transmitter is considered to be particularly used for a mobile phone or the like.

As shown in FIG. 6, the conventional transmitter comprises a modularized power amplifying section 551; an antenna 510; an antenna switch section 552, in the form of IC, for switching the antenna 510; and an external auxiliary matching section 553.

The constitution of the modularized power amplifying section 551 is as follows.

That is, an input wide band matching circuit 501 is connected to an input port 511 to which signals of the first and second frequency bands are inputted. A power amplifying transistor 502 is connected to an output port of the input wide band matching circuit 501. An output main matching circuit 503 is connected to the power amplifying transistor 502.

The antenna switch section 552 comprises transistors 504, 505 connected in series between the output port of the output main matching circuit 503 and the antenna 510; transistors 506, 507 connected in series between the output port of the output main matching circuit 503 and ground; and control ports 513, 514 for them.

The external auxiliary matching section 553 comprises an external capacitance 509 that is for an auxiliary matching circuit; and an external switch 508 for connecting/disconnecting the capacitance 509 and the output main matching circuit 503.

In the above constitution, in the first frequency band, the power amplifying transistor 502 is matched enough for the high efficiency linear amplification by the input wide band matching circuit 501 and the output main matching circuit 503. In the second frequency band, the input side is matched by the input wide band matching circuit 501. However, the output side is not matched enough for the high efficiency linear amplification by the output main matching circuit 503 alone. Thus, the external switch 508 is turned on so as to accomplish the high efficiency linear amplification by the use of the capacitance 509. This high efficiency linear power amplification brings about an effect of increasing a battery longevity of the mobile phone.

When these amplified signals are transmitted, gate voltages applied to the control ports 513, 514 are controlled. Thereby, the in-series transistors 504, 505 operated as the antenna switch are turned on, while the similarly in-series transistors 506, 507 are turned off.

On the other hand, when the signals are not transmitted, the transistors 504, 505 are turned off while the transistors 506, 507 are turned on, whereby the output side is grounded.

The two transistors 504, 505 are connected in series for the following reason. That is, when a transmission output is as high as about 1 W, one transistor alone causes a leakage current and thus it is not completely turned off. Therefore, two transistors are connected in series in order to ensure that the transistor is completely turned off. The transistors 506, 507 are connected in series for the same reason.

However, such a conventional transmitter has a problem as described below. That is, this apparatus requires the external switch for switching the matching circuit so that it may comply with a plurality of frequency bands. Due to this, the number of components are increased. Moreover, this external switch circuit increases a loss.

SUMMARY OF THE INVENTION

The present invention is made in consideration of the conventional problem. An object of the present invention is to provide a power amplifier for linearly amplifying a plurality of frequencies at high efficiency which can simplify a circuit constitution by reducing the number of component elements and can reduce a loss by reducing a circuit space.

A first invention of the present invention is a transmitter comprising:

a power amplifying transistor for amplifying a transmitted signal;

an input wide band matching circuit, connected to an input side of said power amplifying transistor, for matching a plurality of frequency bands;

an output main matching circuit, connected to an output side of said power amplifying transistor, for matching said output side to one frequency band of said plurality of frequency bands;

an antenna;

an antenna switch for switching on/off a connection between the output side of said output main matching circuit and said antenna;

a plurality of in-series transistors, connected to the output side of said output main matching circuit, for grounding the output side of said output main matching circuit when the signal is not transmitted; and an auxiliary matching circuit connected between the in-series connection of said plurality of transistors and ground, wherein said plurality of transistors can be on-off controlled, and when one frequency band other than said one frequency band of said plurality of frequency bands is used, the output side of said power amplifying transistor is matched to the one used frequency band by connecting a predetermined auxiliary matching circuit in all or a part of said auxiliary matching circuit to the output side of said output main matching circuit, under the on-off control in accordance with the used frequency band.

According to this constitution, for example, a plurality of transistors connected in-series are independently switched, whereby they also function as the switch for switching the frequencies. Moreover, the auxiliary matching circuit is connected between a plurality of transistors connected in-series, whereby a plurality of frequency bands can be matched. As a result, compared to the prior art, the number of circuit elements can be reduced, and thus the circuit can be simplified. Since it is also possible to reduce the number of elements from the amplifier output to the antenna, a circuit loss can be reduced.

A second invention of the present invention is a transmitter according to the first invention, wherein a harmonic termination function is also added to said auxiliary matching circuit.

A third invention of the present invention is a transmitter according to the first invention, wherein a filter function is also added to said auxiliary matching circuit.

For example, this constitution can prevent a harmonic signal or a local signal from being transmitted from the antenna.

A fourth invention of the present invention is a transmitter according to any one of the first invention through the third invention, wherein said power amplifying transistor, said input wide band matching circuit, said output main matching circuit, said antenna switch, said plurality of transistors and said auxiliary matching circuit are constituted on the same semiconductor chip.

By this constitution, for example, it is possible to reduce a distance between components, prevent an unnecessary inductance or capacitance from generating and stabilize a circuit operation. It is also possible to reduce the number of components. More preferably, the products with the same condition are mass-produced.

A fifth invention of the present invention is a transmitter according to any one of the first invention through the third invention, wherein said power amplifying transistor, said input wide band matching circuit, said output main matching circuit, said antenna switch and said plurality of transistors are constituted on the same semiconductor chip.

A sixth invention of the present invention is a transmitter according to any one of the first invention through the third invention, wherein said power amplifying transistor, said input wide band matching circuit, said antenna switch and said plurality of transistors are constituted on the same semiconductor chip.

A seventh invention of the present invention is a transmitter according to any one of the first invention through the third invention, wherein said power amplifying transistor and said input wide band matching circuit are constituted on a first semiconductor chip, and said antenna switch and said plurality of transistors are constituted on a second semiconductor chip.

According to this constitution, for example, since the range included in the same semiconductor chip is limited, the semiconductor chip having the higher general-purpose properties can be obtained.

BRIEF DESCRIPTION OF THE INVENTION

DESCRIPTION OF THE PREFERRED EMBODIMENTS

The present invention will be described below on the basis of the accompanying drawings showing the embodiments thereof.

[Embodiment 1]

Figure 1:
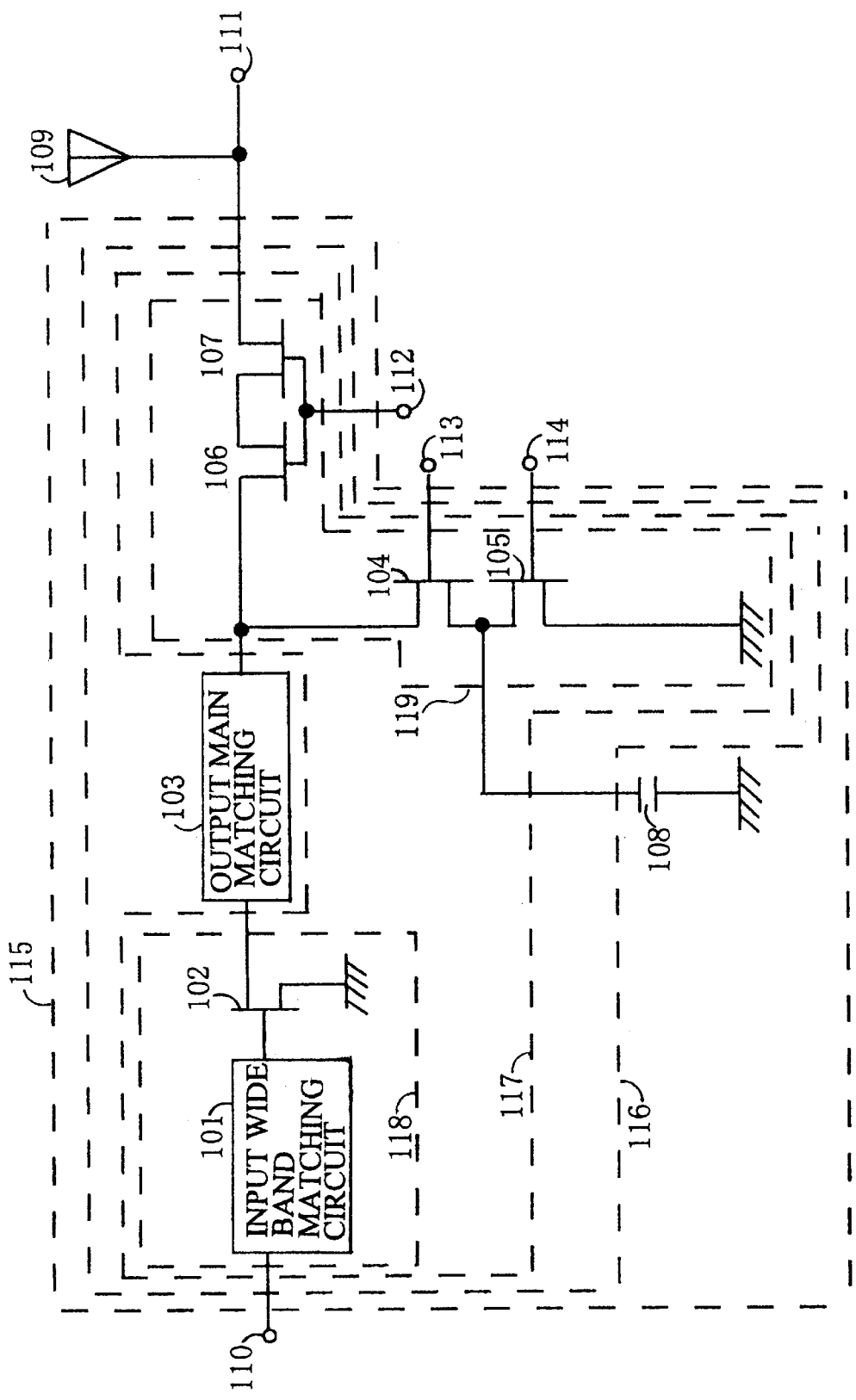
FIG. 1 is a block diagram of a transmitter of a first embodiment of the present invention.

FIG. 1 is a block diagram of a transmitter of a first embodiment of the present invention. The description is provided for a case where two frequency bands are switched to any one of them for transmission, as an example.

In FIG. 1, an input wide band matching circuit 101 is connected to an input port 110 to which the signals of the first and second frequency bands are inputted. A power amplifying transistor 102 is connected to an output port of the input wide band matching circuit 101. An output main matching circuit 103 is connected to the power amplifying transistor 102. Transistors 106, 107, which are operated as an antenna switch, are connected in series between the output port of the output main matching circuit 103 and an antenna 109. Gates of the transistors 106, 107 are connected to a common control port 112. Transistors 104, 105 are connected in series to the output port of the output main matching circuit 103. A source port of the transistor 105 is grounded. An auxiliary matching circuit, a capacitance 108 is connected between the transistors 104 and 105. The other end of the capacitance 108 is grounded. The gates of the transistors 104, 105 are connected to control ports 113, 114, respectively.

Next, the operation of a transmitter of the first embodiment will be described with reference to the accompanying drawings.

For the transmission, a gate voltage of the control port 112 is first controlled so as to turn on the transistors 106, 107. In the first frequency band, the power amplifying transistor 102 is matched by the input wide band matching circuit 101 and the output main matching circuit 103. Thus, the signal inputted to the input port 110 is linearly amplified at high efficiency. At this time, both of the transistors 104, 105 are turned off by controlling the gate voltages of the control ports 113, 114.

On the other hand, in the second frequency band, the power amplifying transistor 102 is not matched enough for the high efficiency linear amplification by the input wide band matching circuit 101 and the output main matching circuit 103 alone. Thus, the gate voltages of the control ports 113, 114 are independently controlled, whereby the transistor 104 is turned on while the transistor 105 is turned off.

The auxiliary matching circuit, the capacitance 108 is thus connected to the output side of the output main matching circuit 103. The power amplifying transistor 102 is matched by the capacitance 108 as well as the input wide band matching circuit 101 and the output main matching circuit 103. The high efficiency linear amplification can be therefore accomplished.

During the transmission in the second frequency band, one transistor 105 alone is turned off so as to perform the conventional operation, as described above. However, when the transistor 105 is off, the impedance on the side of the connection of the capacitance 108 is lower than the impedance between the source port of the transistor 105 and the ground. This ensures that the transistor 105 is off. There is not caused a problem in which a leakage current or the like is generated.

Next, when the signals are not transmitted, the transistors 106, 107 are turned off and the transistors 104, 105 are turned on so as to thereby ground the output side, as in the case of the conventional constitution.

In the first embodiment, there is illustrated the case where the capacitance is used for the auxiliary matching in two frequency bands. Alternatively, the same matching can be accomplished by using a combination circuit of an inductance and a DC cut capacitor as a passive component other than the capacitance.

Figure 5:
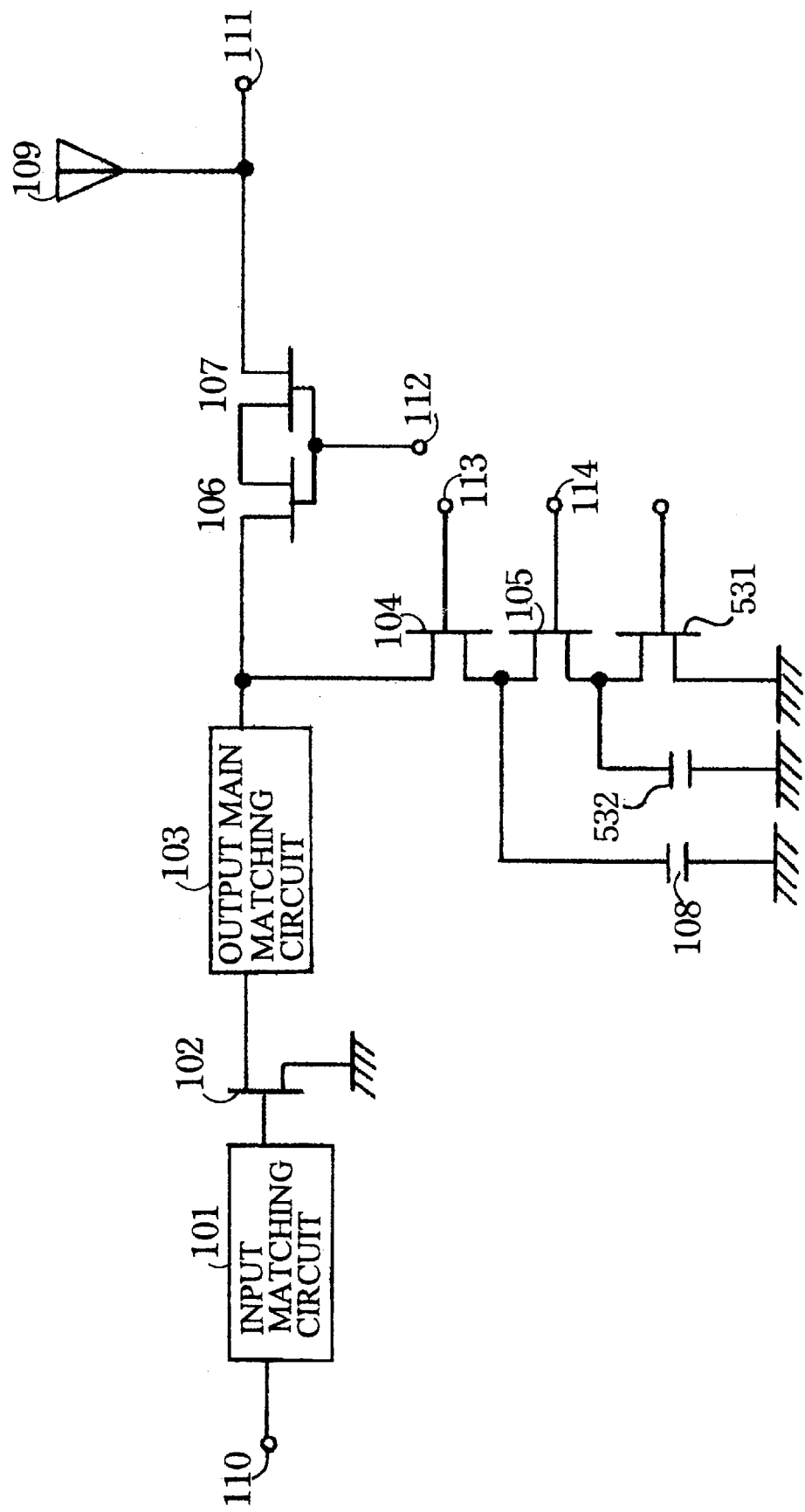
FIG. 5 is a block diagram of the alternative transmitter of the first embodiment of the present invention.
Figure 6:
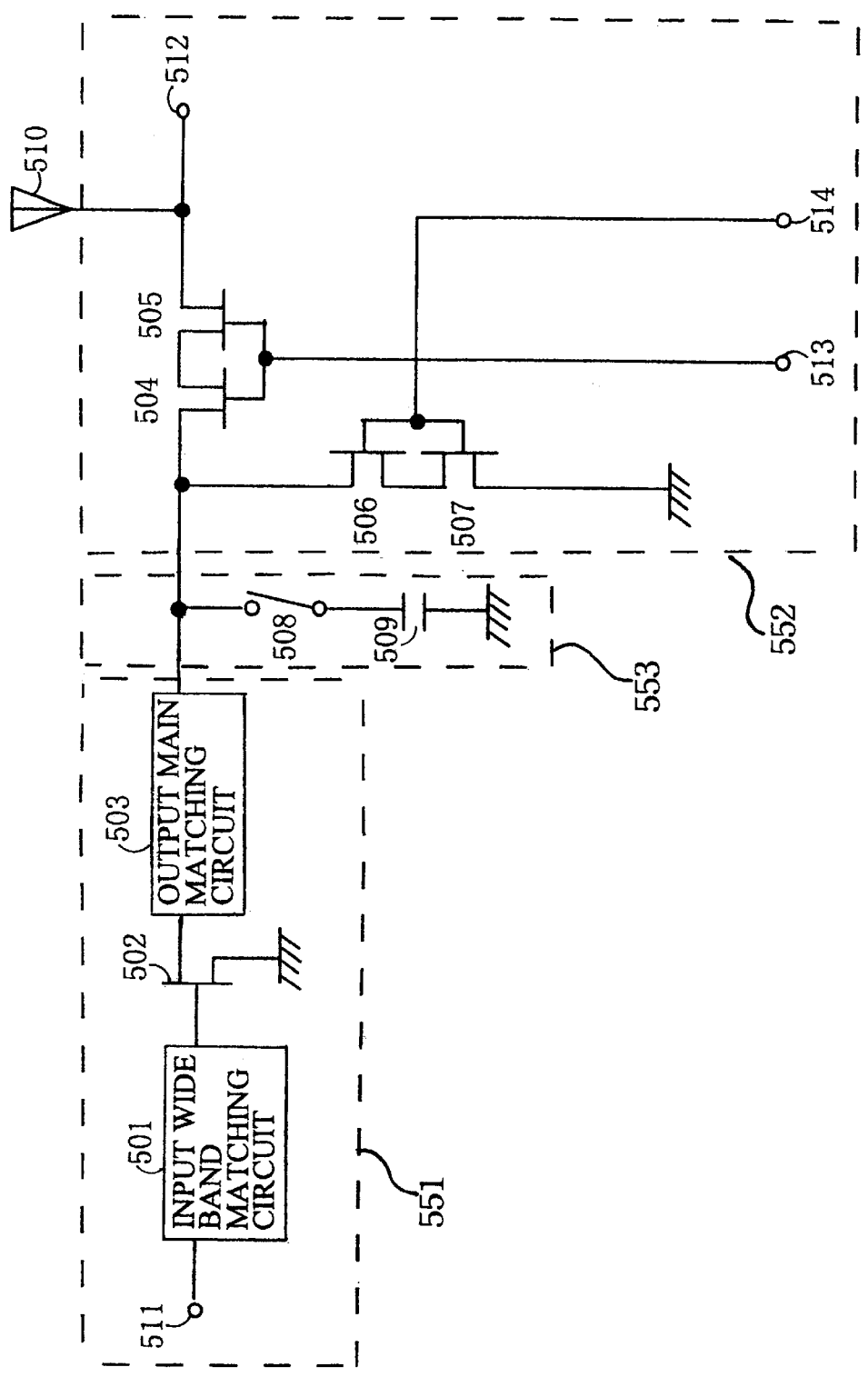
FIG. 6 is a block diagram of the conventional transmitter.

Moreover, the number of the in-series transistors 104, 105 is increased. Then, the auxiliary matching circuits connected to the connections between these transistors are added so that they may comply with the frequency bands. Thus, of course, the apparatus can be generally used in a plurality of n frequency bands. In this case, the effect of reducing the number of elements can be further enhanced. For example, as shown in FIG. 5, the number of the in-series transistors is set to 3 (indicated by numerals 104, 105 and 531 in the drawing). The capacitance 108 and 532, which are operated as the auxiliary matching circuits having different values, are then connected to the connections between the transistors. The apparatus is constituted so that the on-off operation of the transistors may be controlled in the following manner. Thereby, the auxiliary matching circuits can comply with three frequency bands. In FIG. 5, the same elements as FIG. 1 have the same reference numerals.

That is, the transmission in the first and second frequency bands is performed in the same manner as described above. In that case, the transistors 105, 531 are off. For the transmission in a third frequency band, the transistors 104, 105 are turned on and the transistor 531 is tuned off. Thereby, a parallel circuit of the capacitance 108, 532 is connected to the output side of the output main matching circuit 103.

As described above, according to this embodiment, there is no need for the external switch for the auxiliary matching like the conventional constitution. Therefore, when this transmitter is used in a mobile telephone such as a mobile phone, the loss reduction due to the elimination of the external switch allows a battery longevity to be further increased. Moreover, since the number of components is reduced, the circuit can be simplified. This embodiment exhibits the above effects. Also, this allows a mobile phone body to be miniaturized.

[Embodiment 2]

Figure 2:
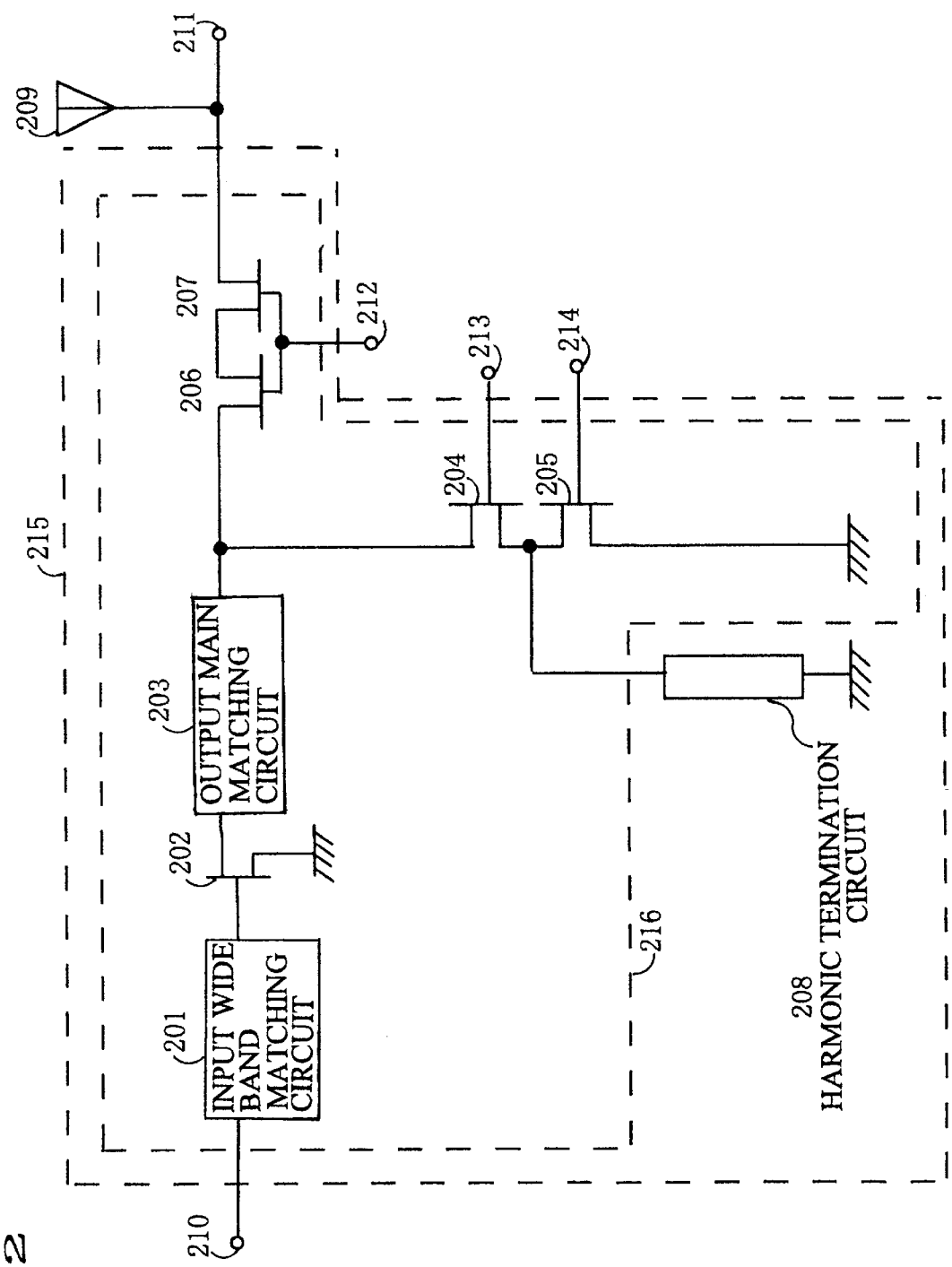
FIG. 2 is a block diagram of the transmitter of a second embodiment of the present invention.

FIG. 2 is a block diagram of the transmitter of a second embodiment of the present invention. This description is also provided for the transmission of two frequency bands, as an example.

In FIG. 2, an input wide band matching circuit 201 is connected to an input port 210 to which the signals of the first and second frequency bands are inputted. A power amplifying transistor 202 is connected to the output port of the input wide band matching circuit 201. An output main matching circuit 203 is connected to the power amplifying transistor 202. Transistors 206, 207, which are operated as the antenna switch, are connected in series between the output port of the output main matching circuit 203 and the antenna. The gates of the transistors 206, 207 are connected to a common control port 212. The function of a harmonic termination in the first frequency band is added to the output main matching circuit 203 of this embodiment. Transistors 204, 205 are connected in series to the output port of the output main matching circuit 203. The source port of the transistor 205 is grounded. A harmonic termination circuit 208 is connected between the transistors 204 and 205. The other end of the harmonic termination circuit 208 is grounded. The harmonic termination circuit 208 also has the function of the auxiliary matching in the second frequency band. The gates of the transistors 204, 205 are connected to control ports 213, 214, respectively.

Figure 3:
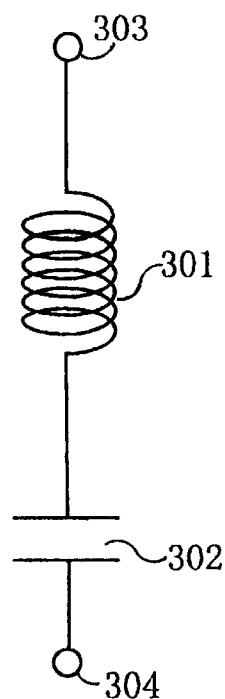
FIG. 3 shows an illustrative example of a harmonic termination circuit of the second embodiment of the present invention.

An illustrative example of the harmonic termination circuit is shown in FIG. 3. This harmonic termination circuit is constituted as described below. An inductance 301 is connected to a port 303. A capacitance 302 is connected to the other end of the inductance 301. A port 304 is connected to the other end of the capacitance 302. The port 303 is connected between the transistors 204 and 205 connected in series. The port 304 is grounded.

Next, the operation of the transmitter of the second embodiment will be described with reference to the accompanying drawings.

For the transmission, the gate voltage of the control port 212 is first controlled so as to turn on the transistors 206, 207. In the first frequency band, the power amplifying transistor 202 is matched by the input wide band matching circuit 201 and the output main matching circuit 203. Thus, the signal is linearly amplified at high efficiency. Since the output main matching circuit 203 has the function of the harmonic termination, it also removes a harmonic signal.

On the other hand, in the second frequency band, the power amplifying transistor 202 is not matched enough for the high efficiency linear amplification by the input wide band matching circuit 201 and the output main matching circuit 203 alone. The harmonic termination does not sufficiently function. Thus, the gate voltages of the control ports 213, 214 are independently controlled, whereby the transistor 204 is turned on while the transistor 205 is turned off. The harmonic termination circuit 208 is thus connected to the output side of the output main matching circuit 203. The power amplifying transistor 202 is matched by the harmonic termination circuit 208 as well as the input wide band matching circuit 201 and the output main matching circuit 203. The high efficiency linear amplification can be therefore accomplished. The harmonic termination can be also accomplished in the second frequency band.

Figure 4:
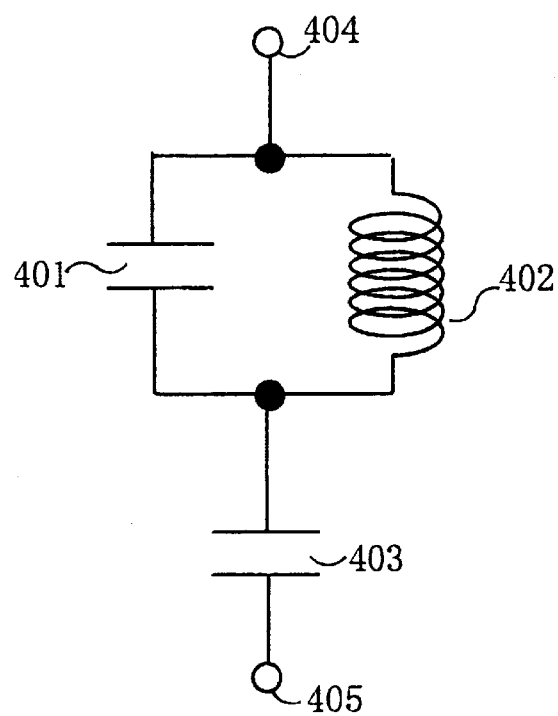
FIG. 4 shows an illustrative example of a filter circuit of the second embodiment of the present invention.

A filter function is provided to the output main matching circuit 203. The harmonic termination circuit 208 is replaced by a filter circuit. An undesired signal can be thus removed in two frequency bands. An illustrative example of the filter circuit is shown in FIG. 4. This filter circuit is constituted as described below. A capacitance 401 and an inductance 402 are connected in parallel to a port 404. A capacitance 403 is connected to the other end of the capacitance 401 and the inductance 402. A port 405 is connected to the other end of the capacitance 403. The port 404 is connected between the transistors 204 and 205 connected in series. The port 405 is grounded.

In the second embodiment, there is illustrated the transmission in two frequency bands. On the other hand, the number of the in-series transistors 204, 205 is increased. Then, the harmonic termination circuits or the filter circuits connected to these transistors are added so that they may comply with the frequency bands. Thus, of course, the apparatus can be generally used in a plurality of n frequency bands (see FIG. 5). Thus, the effect of reducing the number of elements can be further improved.

As described above, according to this embodiment, the switch for the auxiliary matching is not needed. The loss due to the switch is reduced. The circuit can be also simplified by reducing the number of components. It is also possible to prevent the undesired signal outside a transmission frequency band from being transmitted from the antenna. Therefore, when this transmitter is used in the mobile telephone such as the mobile phone, another effect is obtained in addition to the effects described in the first embodiment. That is, since it is possible to prevent the undesired signal outside the transmission frequency band from being transmitted from the antenna, an interference with other mobile phones can be prevented.

[Embodiment 3]

Next, a third embodiment will be described in which the circuits of the first and second embodiments are formed into an integrated circuit.

The portion surrounded by a broken line 115 of FIG. 1, namely, the portion including the input wide band matching circuit 101, the power amplifying transistor 102, the output main matching circuit 103, the transistors 104–107 and the capacitance 108 is implemented on the same semiconductor chip.

Alternatively, the range surrounded by a broken line 215 of FIG. 2, namely, the portion including the input wide band matching circuit 201, the power amplifying transistor 202, the output main matching circuit 203, the transistors 204–207 and the harmonic termination circuit 208 is implemented on the same semiconductor chip.

By this constitution, it is possible to reduce a distance between the components, prevent an unnecessary inductance or capacitance from generating and stabilize a circuit operation. It is also possible to reduce the number of components. More preferably, the products with the same condition are mass-produced.

For complying with the use of the apparatus in different frequency bands, the range which is surrounded by a broken line 116 of FIG. 1 so that the capacitance 108 is regarded as the external component, i.e., the portion including the input wide band matching circuit 101, the power amplifying transistor 102, the output main matching circuit 103 and the transistors 104–107 is implemented on the same semiconductor chip.

Alternatively, the range which is surrounded by a broken line 216 of FIG. 2 so that the harmonic termination circuit 208 is regarded as the external component, i.e., the portion including the input wide band matching circuit 201, the power amplifying transistor 202, the output main matching circuit 203 and the transistors 204–207 is implemented on the same semiconductor chip.

Alternatively, the range which is surrounded by a broken line 117 of FIG. 1 so that the output main matching circuit 103 and the capacitance 108 are regarded as the external components, i.e., the portion including the input wide band matching circuit 101, the power amplifying transistor 102 and the transistors 104–107 is implemented on the same semiconductor chip.

This constitution can comply with different frequencies. In consideration of the production quantity or the like, the apparatus has the general-purpose properties. For example, when the apparatus is used in the mobile phone, the apparatus can be applied to many types and thus the range of the application may be expanded.

Alternatively, the range surrounded by a broken line 118 of FIG. 1, i.e., the portion including the input wide band matching circuit 101 and the power amplifying transistor 102 is constituted on a first semiconductor chip. Moreover, the range surrounded by a broken line 119, i.e., the transistors 104–107 are constituted on a second semiconductor chip. Thereby, the general-purpose properties are further improved.

In this description, the portion surrounded by each broken line between the ports 110 and 111 is constituted on the same semiconductor chip. However, it makes no difference that the range including at least the above-described range, the circuit previous to the port 110 and the circuit following the port 111 are constituted on the same semiconductor chip.

The details of the circuit constructions of the above embodiments can be optionally changed or replaced by other circuit having the same function. The changes in the details can be made within the scope of the appended claims. The present invention is not limited to the illustrative circuit constructions.

As described above, the exclusive external switch for switching the matching circuits is not needed. The loss due to the switch can be reduced. The circuit constitution can be also simplified by reducing the number of components.

According to the constitution of claim 2 or 3, in addition to the effects which the constitution of claim 1 brings about, it is possible to prevent the undesired signal outside the transmission frequency band from being transmitted from the antenna.

According to the constitutions of claims the elements of the present invention are integrated on the same semiconductor chip, whereby it is possible to reduce the distance between the components, prevent the unnecessary inductance or capacitance from generating and stabilize the circuit operation. It is also possible to reduce the number of components. Moreover, the range of the elements on the semiconductor chip is changed in accordance with a load impedance, a frequency range or other changes, whereby the present invention can comply with various changes.

What is claimed is:

1. A transmitter comprising:

a power amplifying transistor for amplifying a transmitted signal;

an input wide band matching circuit, connected to an input side of said power amplifying transistor, for matching a plurality of frequency bands;

an output main matching circuit, connected to an output side of said power amplifying transistor, for matching said output side to one frequency band of said plurality of frequency bands;

an antenna;

an antenna switch for switching on/off a connection between the output side of said output main matching circuit and said antenna;

a plurality of in-series transistors, connected to the output side of said output main matching circuit, for grounding the output side of said output main matching circuit when the signal is not transmitted; and an auxiliary matching circuit connected between the in-series connection of said plurality of transistors and ground, wherein said plurality of transistors can be on-off controlled, and when one frequency band other than said one frequency band of said plurality of frequency bands is used, the output side of said power amplifying transistor is matched to the one used frequency band by connecting a predetermined auxiliary matching circuit in all or a part of said auxiliary matching circuit to the output side of said output main matching circuit, under the on-off control in accordance with the used frequency band.

2. A transmitter according to claim 1, wherein a harmonic termination function is also added to said auxiliary matching circuit.

3. A transmitter according to claim 1, wherein a filter function is also added to said auxiliary matching circuit.

4. A transmitter according to claim 1, wherein said power amplifying transistor, said input wide band matching circuit, said output main matching circuit, said antenna switch, said plurality of transistors and said auxiliary matching circuit are constituted on the same semiconductor chip.

5. A transmitter according to claim 2, wherein said power amplifying transistor, said input wide band matching circuit, said output main matching circuit, said antenna switch, said plurality of transistors and said auxiliary matching circuit are constituted on the same semiconductor chip.

6. A transmitter according to claim 3, wherein said power amplifying transistor, said input wide band matching circuit, said output main matching circuit, said antenna switch, said plurality of transistors an d said auxiliary matching circuit are constituted on the same semiconductor chip.

7. A transmitter according to claim 1, wherein said power amplifying transistor, said input wide band matching circuit, said output main matching circuit, said antenna switch and said plurality of transistors are constituted on the same semiconductor chip.

8. A transmitter according to claim 2, wherein said power amplifying transistor, said input wide band matching circuit, said output main matching circuit, said antenna switch and said plurality of transistors are constituted on the same semiconductor chip.

9. A transmitter according to claim 3, wherein said power amplifying transistor, said input wide band matching circuit, said output main matching circuit, said antenna switch and said plurality of transistors are constituted on the same semiconductor chip.

10. A transmitter according to claim 1, wherein said power amplifying transistor, said input wide band matching circuit, said antenna switch and said plurality of transistors are constituted on the same semiconductor chip.

11. A transmitter according to claim 2, wherein said power amplifying transistor, said input wide band matching circuit, said antenna switch and said plurality of transistors are constituted on the same semiconductor chip.

12. A transmitter according to claim 3, wherein said power amplifying transistor, said input wide band matching circuit, said antenna switch and said plurality of transistors are constituted on the same semiconductor chip.

13. A transmitter according to claim 1, wherein said power amplifying transistor and said input wide band matching circuit are constituted on a first semiconductor chip, and said antenna switch and said plurality of transistors are constituted on a second semiconductor chip.

14. A transmitter according to claim 2, wherein said power amplifying transistor and said input wide band matching circuit are constituted on a first semiconductor chip, and said antenna switch and said plurality of transistors are constituted on a second semiconductor chip.

15. A transmitter according to claim 3, wherein said power amplifying transistor and said input wide band matching circuit are constituted on a first semiconductor chip, and said antenna switch and said plurality of transistors are constituted on a second semiconductor chip.

16. A mobile telephone comprising the transmitter according to claim 1.

17. A transmitter according to claim 1, wherein said plurality of transistors can be on-off controlled separately.

* * * * *